United States Patent [19]
Liao

[11] Patent Number: 6,069,037
[45] Date of Patent: May 30, 2000

[54] METHOD OF MANUFACTURING EMBEDDED DRAM

[75] Inventor: Kuan-Yang Liao, Taipei, Taiwan

[73] Assignee: United Silicon Incorporated, Hsinchu, Taiwan

[21] Appl. No.: 09/191,677

[22] Filed: Nov. 13, 1998

[30] Foreign Application Priority Data

Aug. 25, 1998 [TW] Taiwan .................................. 87113976

[51] Int. Cl.$^7$ ............................................. H01L 21/8242
[52] U.S. Cl. ............................................. 438/241; 438/655
[58] Field of Search .................................. 438/210, 241, 438/253, 275, 396, 655, 656, 657

[56] References Cited

U.S. PATENT DOCUMENTS

| | | | |
|---|---|---|---|
| 5,668,035 | 9/1997 | Fang et al. | 438/241 |
| 5,863,820 | 1/1999 | Huang | 438/241 |
| 5,998,251 | 9/1999 | Wu et al. | 438/241 |

Primary Examiner—Chandra Chaudhari
Attorney, Agent, or Firm—J. C. Patents; Jiawei Huang

[57] ABSTRACT

A method of manufacturing embedded DRAM whose DRAM gate is formed from a tungsten silicide layer and a polysilicon layer and whose logic gate is formed from a self-aligned silicide layer and a polysilicon layer. Moreover, the polysilicon layer in the DRAM gate and the logic gate has different thickness. The method of forming embedded DRAM includes the steps of forming a DRAM gate pattern and a logic gate pattern on a first photoresist layer. Next, the underlying silicon nitride layer, tungsten silicide layer and the second polysilicon layer are etched to form a DRAM gate structure. Thereafter, a second photoresist layer is formed over the DRAM circuit region. Finally, using the remaining silicon nitride layer, tungsten silicide layer and second polysilicon layer as an etching mask, the exposed layers in the logic circuit region are etched to form a logic gate composed of the first polysilicon layer, only. Consequently, only two photoresist masks are needed in the fabrication of DRAM gate and logic gate, and hence the degree of complexity in manufacture is greatly reduced.

22 Claims, 5 Drawing Sheets

METHOD OF MANUFACTURING EMBEDDED DRAM

CROSS-REFERENCE TO RELATED APPLICATION

This application claims the priority benefit of Taiwan application serial no. 87113976, filed Aug. 25, 1998, the full disclosure of which is incorporated herein by reference.

BACKGROUND OF THE INVENTION

1. Field of Invention

The present invention relates to a method of manufacturing integrated circuit devices. More particularly, the present invention relates to a method of manufacturing the memory cells and logic cells of an integrated circuit on a single silicon chip.

2. Description of Related Art

Embedded dynamic random access memory (DRAM) is a type of integrated circuit having both its memory cells and logic cells formed on a single silicon chip. Embedded DRAM is capable of transferring large quantity of data at a very high speed. Due to its high memory capacity and speed, embedded DRAM has been used inside high volume processing circuits, an example of which is a graphic processor. A complete embedded DRAM includes logic circuits, a transfer field effect transistor (transfer FET) and a capacitor coupled to the transfer FET. The transfer FET actually acts as a switch between the lower electrode of the capacitor and a bit line. Therefore, data within the capacitor can be written in or read out.

FIGS. 1A through 1E are schematic, cross-sectional views showing the progression of manufacturing steps in producing a conventional embedded DRAM. FIG. 1A is a schematic, cross-sectional view of the conventional embedded DRAM half way through the manufacturing process. On the right is a partially finished DRAM cell 170 while on the left is a partially finished logic transistor 172. The DRAM cells and the logic circuits of an embedded DRAM are formed above a substrate 100 on a single chip. Normally, the substrate is a P-type silicon substrate. In general, device isolation regions 102 are formed using a local oxidation of silicon (LOCOS) method. Alternatively, devices can be isolated by forming shallow trench isolation structures. Shallow trench isolation structures are formed by first etching out a trench, and then depositing oxide material into the trench using a chemical vapor deposition method.

In order to lower the resistivity of the gate layer, a layer of polysilicon and a layer of metallic silicide layer are deposited in sequence to form a polycide layer, and then the polycide layer is patterned. Alternatively, a polysilicon layer is first deposited over the substrate, then the polysilicon layer is patterned. Next, a metallic layer is deposited over the patterned polysilicon layer, and then a self-aligned silicide reaction is carried out to form metallic silicide layers above the polysilicon layer and the source/drain region at the same time.

However, using a self-aligned silicide process can lead to a shallow junction in the source/drain region, which can result in the generation of a large leakage current at the junction between capacitor and the source/drain region. Therefore, the gate layer of a DRAM cell comprises a polysilicon layer 112 and a metallic silicide layer. The metallic silicide layer on top of the source/drain region 124 is not formed by a self-aligned silicide process so that charge leakage can be avoided. On the other hand, the sheet resistance of the source/drain region 126 in the transistor of a logic circuit is normally lowered by forming a metallic silicide layer over the source-drain region 126 using a self-aligned silicide process.

Conventionally, the method of forming gate structures 104 and 106 includes, for example, forming an oxide layer over the substrate 100 using a thermal oxidation method. Then, a doped polysilicon layer, a tungsten silicide layer and a silicon nitride layer are sequentially formed over the oxide layer using a chemical vapor deposition method. Next, various layers are etched to form gate oxide layers 108 and 110, polysilicon layers 112 and 114, titanium silicide and metallic silicide layers 116 and 118, and silicon nitride gate cap layers 120 and 122. The source/drain regions 124 and 126 are formed by an impurity implantation using the gate cap layers 120 and 122 as masks.

Next, as shown in FIG. 1B, an annealing operation is carried out between 900° C. to 1000° C. Hence, the heat causes the dopants to diffuse evenly within the source/drain regions 124 and 126 to form source/drain regions 124a and 126a. Thereafter, spacers 128 and 130 are formed on the respective sidewalls of the gate structures 104 and 106. Then, the DRAM cell of the right is covered by an insulating layer 140.

Next, as shown in FIG. 1C, a self-aligned silicide process is performed to form a metallic silicide layer over the source/drain region 126. First, a refractory metallic layer 142 such as a titanium layer is formed over the substrate 100 using, for example, a physical vapor deposition method.

Next, as shown in FIG. 1D, the device is rapidly heated to about 700° C. to 800° C. for an annealing operation so that silicon in the source/drain region 126a reacts with metal in the metallic layer 142 to form a self-aligned silicide layer 150. Thereafter, unreacted titanium is removed by placing the substrate in a solution of hydrogen peroxide ($H_2O_2$) and ammonia ($NH_4OH$) to carry out a wet etching operation. Finally, a second annealing operation is carried out to lower the resistivity of the metal silicide layer 150 above the source/drain region 126a.

Subsequently, as shown in FIG. 1E, a thick dielectric layer 152 is formed over the substrate 100, and then a contact opening 154 is formed in the dielectric layer 152 exposing the source/drain region 124a. Next, a conductive layer 156, a dielectric thin film 158 and another conductive layer 160 are sequentially formed above the substrate 100. Hence, a capacitor having electrical connection with the source/drain region 124a is formed.

In general, the logic circuit area and the memory cell area in an embedded DRAM have different gate structures. The gate of a DRAM cell normally comprises a tungsten silicide layer and a polysilicon layer, while the gate in a logic circuit area comprises a metal silicide layer and a polysilicon layer. Therefore, at least three masks must be used to pattern the DRAM gate and the logic gate. The number of masks used is closely related to the complexity of the manufacturing operation, reliability and yield rate. If the number of masking operations can be reduced, reliability and control of production can be increased and cost of production can be lowered.

In light of the foregoing, there is a need provide a better method of manufacturing embedded DRAMs.

SUMMARY OF THE INVENTION

Accordingly, the present invention provides a method of manufacturing embedded DRAM that requires only two masks to pattern out DRAM gates and logic gates. Only one of the masks is a critical mask requiring precise dimensions, while the other one is a non-critical mask. Hence, complexity of the manufacturing operation can be lowered considerably, and production cost can be saved.

To achieve these and other advantages and in accordance with the purpose of the invention, as embodied and broadly described herein, the invention provides a method of manufacturing embedded DRAM. The method includes the steps of forming a first gate oxide layer and field oxide layer over a substrate, and then sequentially forming a first polysilicon layer and an etching barrier layer over the first gate oxide layer and the field oxide layer. Next, photolithographic and etching processes are used to remove the first polysilicon layer, the etching barrier layer and the first gate oxide layer above the DRAM circuit region. Thereafter, a second gate oxide layer is formed over the DRAM circuit region. Subsequently, a second polysilicon layer, a tungsten silicide layer and a silicon nitride layer are sequentially formed over the entire substrate. A patterned first photoresist layer is then used to pattern out the DRAM gate and the logic gate such that a portion of the silicon nitride layer, the tungsten silicide layer and the second polysilicon layer are removed to expose the second gate oxide layer in the DRAM circuit region and the etching barrier layer in the logic circuit region.

After that, the first photoresist layer is removed, and then a second photoresist layer is formed over the DRAM circuit region. Next, the exposed layers above the logic circuit region are removed, only retaining a portion of the etching barrier layer and the first polysilicon layer for forming the logic gate in a subsequent process. Thereafter, the second photoresist layer is removed, and then LDD masking and implantation are performed. After that, a thin nitride layer is deposited and the spacer is formed on the sidewalls of the gate in the logic region. The DRAM region is covered by the nitride layer. Next, N$^+$ and P$^+$ source/drain masks and implantation are formed in the source/drain regions on each side of the gate structure. Finally, self-aligned silicide layers are formed above the first polysilicon layer and the source/drain regions in the logic circuit region. Hence, the manufacturing operations for forming an embedded DRAM using different gate materials in DRAM circuit and logic circuit are complete.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
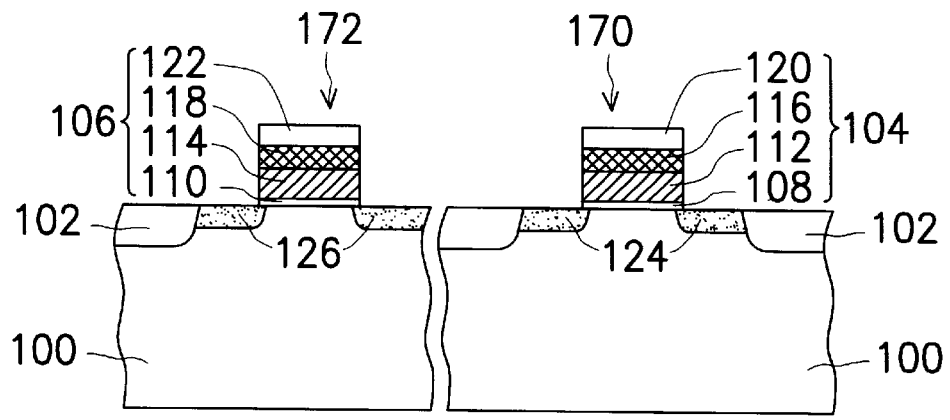
FIGS. 1A through 1E are schematic, cross-sectional views showing the progression of manufacturing steps in producing a conventional embedded DRAM.
Figure 1B:
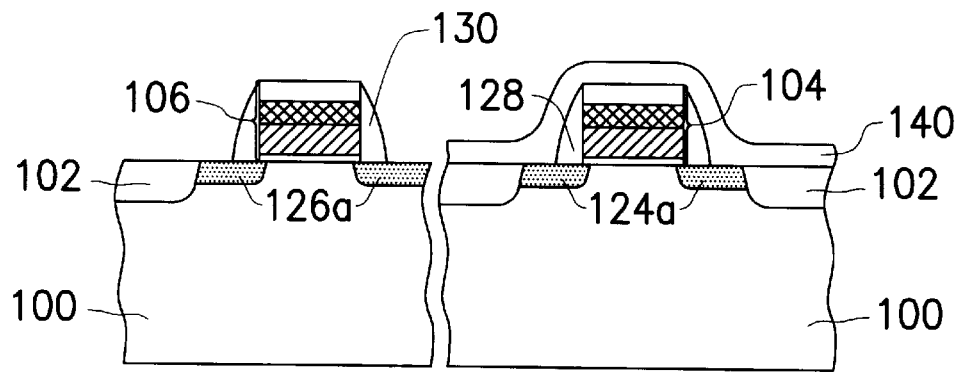
Figure 1C:
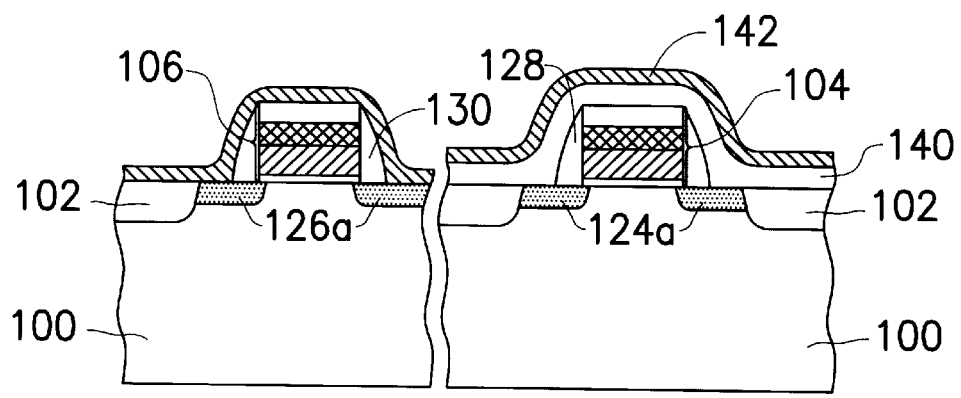
Figure 1D:
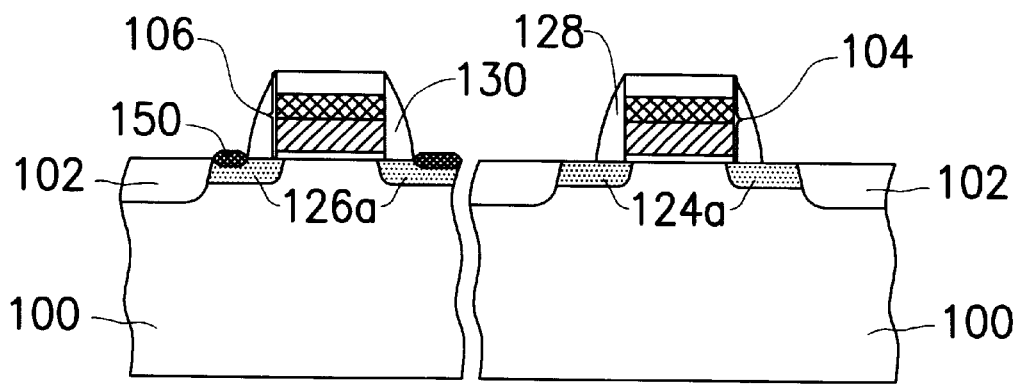
Figure 1E:
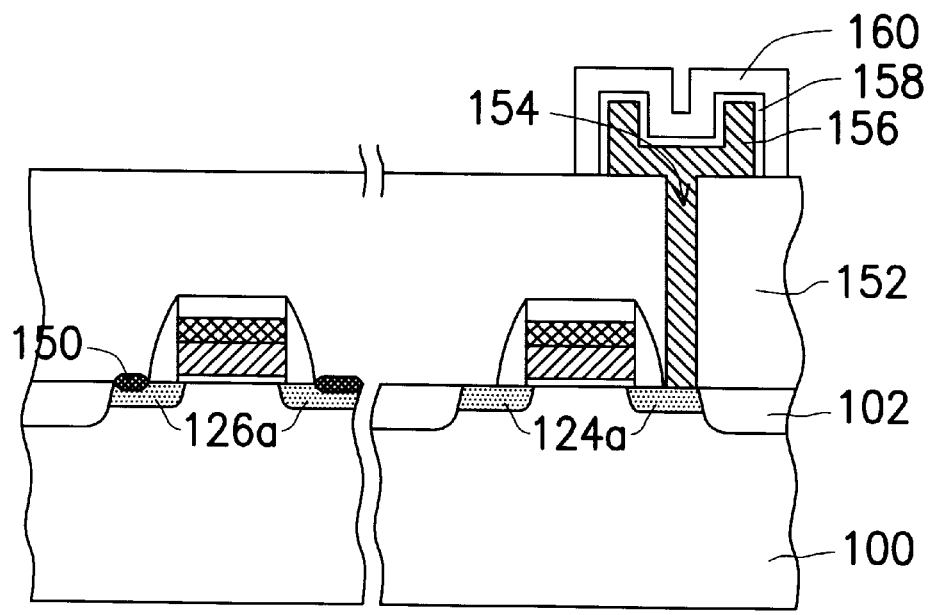

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2I are schematic, cross-sectional views showing the progression of manufacturing steps in producing an embedded DRAM according to one preferred embodiment of this invention.

Figure 2A:
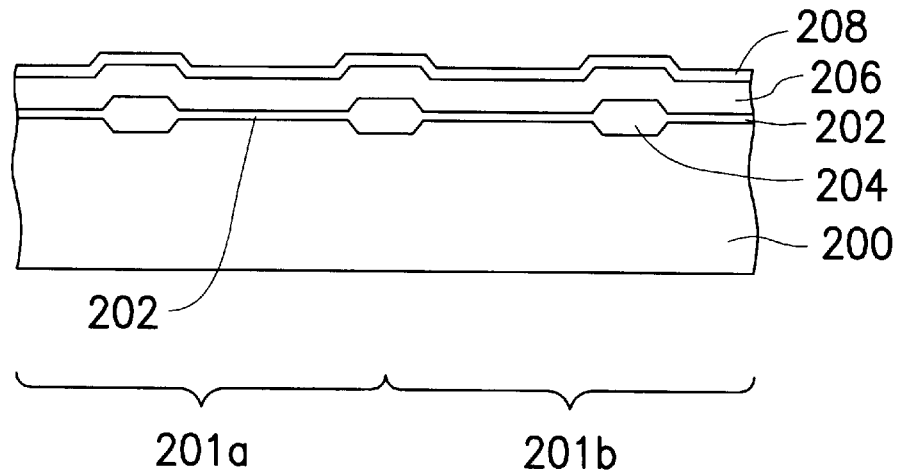
FIGS. 2A through 2I are schematic, cross-sectional views showing the progression of manufacturing steps in producing an embedded DRAM according to one preferred embodiment of this invention.

As shown in FIG. 2A, a semiconductor substrate 200 is provided. The semiconductor substrate 200 can be divided into two regions, a region 201a for forming the DRAM circuits and a region 201b for forming logic circuits. There is a first gate oxide layer 202 and a field oxide layer 204 above the substrate in both regions 201a and 201b. Next, a first polysilicon layer 206 and an etching barrier layer 208 are sequentially formed above the field oxide layer 204 and the first gate oxide layer 202. The first polysilicon layer 206 has a thickness of about 2000 Å, while the etching barrier layer 208 has a thickness of about 300 Å. The etching barrier layer 208 can be, for example, a silicon nitride layer or a silicon dioxide layer.

Figure 2B:
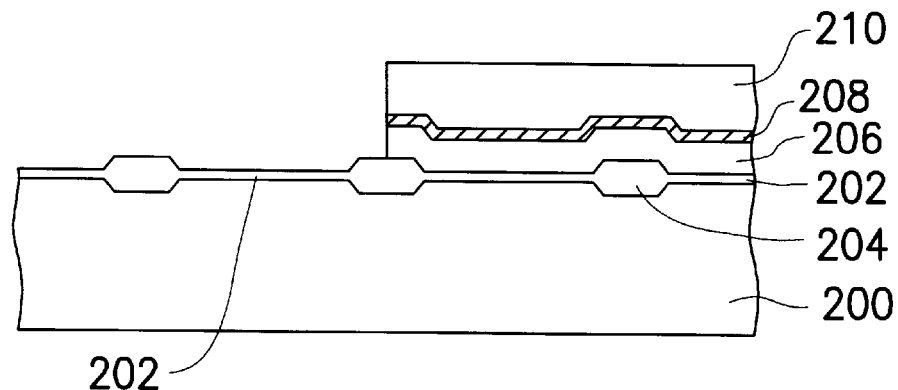

As shown in FIG. 2B, a mask layer 210 is formed over the etching barrier layer 208 in the logic circuit region 210B (FIG. 2A). Then, the etching barrier layer 208 and the first polysilicon layer 206 in the DRAM circuit region 201a is removed using an isotropic wet etching operation.

Figure 2C:
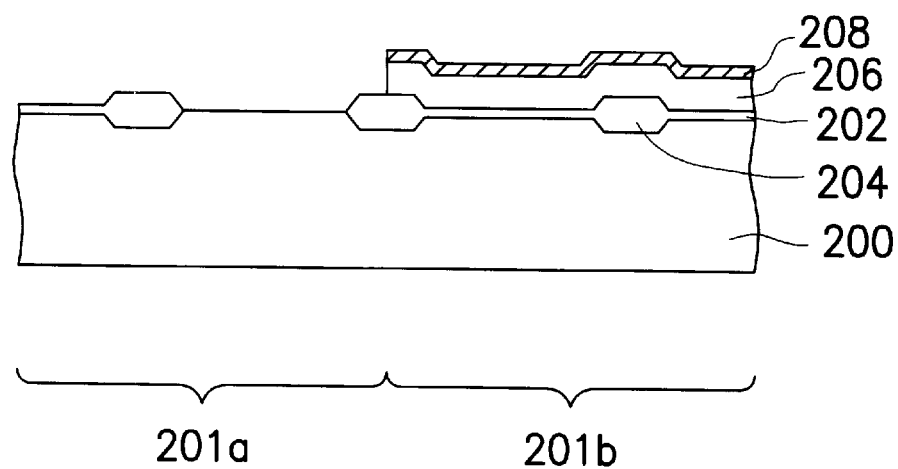

As shown in FIG. 2C, the mask layer 210 above the etching barrier layer 208 is removed, and then the first gate oxide layer 202 over the DRAM circuit region 201a is stripped away to expose the substrate 200 surface.

Figure 2D:
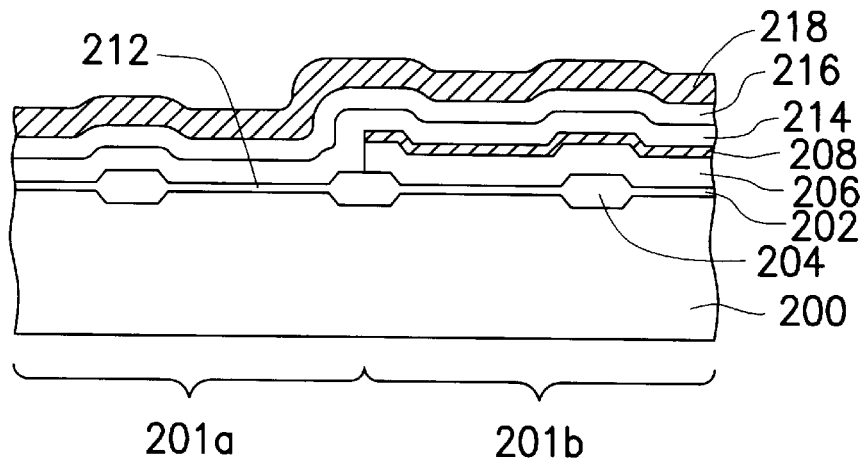

As shown in FIG. 2D, a second gate oxide layer 212 is formed over the exposed substrate 200 acting as a DRAM gate oxide layer. Thereafter, a second polysilicon layer 214, a tungsten silicide layer 216 and a silicon nitride layer 218 are sequentially formed over the second gate oxide layer 212 and the etching barrier layer 208. The second polysilicon layer 214, the tungsten silicide layer 216 and the silicon nitride layer 218 etch has a thickness of about 1000 Å.

Figure 2E:
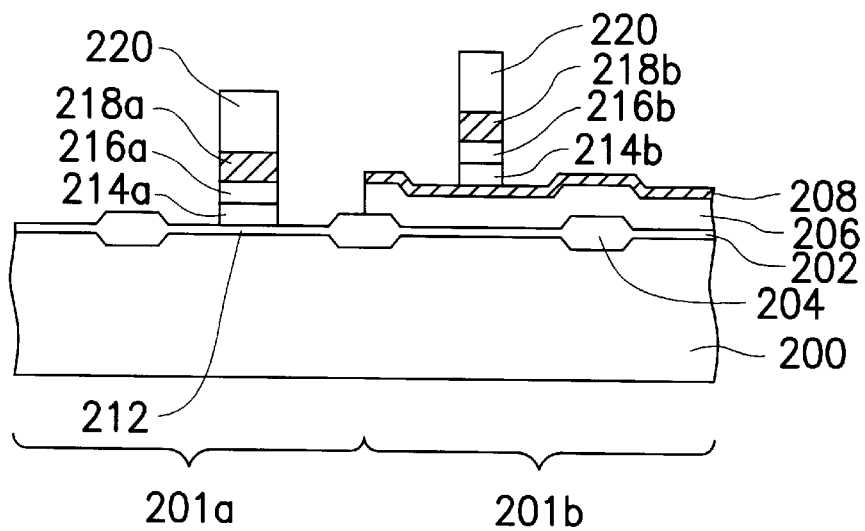

In the subsequent step, as shown in FIG. 2E, photolithographic and etching operations are carried out. First, a first patterned photoresist layer 220 is deposited over the silicon nitride layer 218 for patterning the DRAM circuit region 201a and the logic circuit region 201b. Next, using the first photoresist layer 220 as a mask, the silicon nitride layer 218, the tungsten silicide layer 216 and the second polysilicon layer 214 are etched, thereby exposing the second gate oxide layer 212 in the DRAM circuit region 201a and exposing the etching barrier layer 208 in the logic circuit region 201b. Consequently, the silicon nitride layers 218a and 218b, the tungsten silicide layers 216a and 216b and the second polysilicon layers 214a and 214b all underneath the first photoresist layer 220 are retained. The first photoresist layer 220 is a critical mask. In other words, dimensions patterned out using this mask are smaller and higher alignment accuracy is demanded.

Figure 2F:
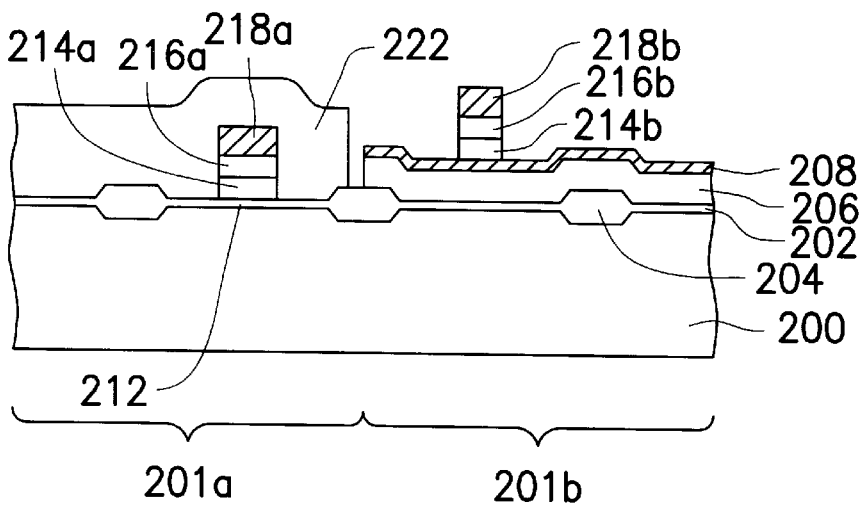

As shown in FIG. 2F, the first photoresist layer 220 is removed. Thereafter, a second photoresist layer 222 is deposited over the DRAM circuit region 201a for protecting the gate structure that includes the second polysilicon layer 214a, the tungsten silicide layer 216a and the silicon nitride layer 218a. The second photoresist layer is a non-critical mask with a larger area of coverage. Therefore, a larger misalignment error can be tolerated.

Figure 2G:
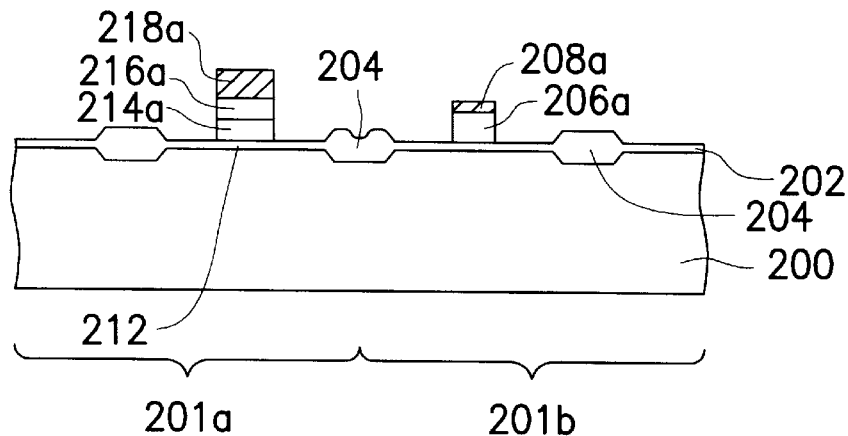

Thereafter, as shown in FIG. 2G, exposed layers above the logic circuit region 201b are etched to remove the silicon nitride layer 218b, the tungsten silicide layer 216b, the second polysilicon layer 214b, most of the etching barrier layer 208 and the first polysilicon layer 206 underneath the barrier layer 208. In the above etching operation, the second polysilicon layer 214b, the tungsten silicide layer 216b and the silicon nitride layer 218b formed in the previous step (refer to FIG. 2F) are used as a hard mask for removing the etching barrier layer 208a and the first polysilicon layer 206a. After the etching operation, the entire hard mask is also removed. The first polysilicon layer 206a that remains after the etching operation is later used to form the gate in the logic circuit region 201b. Finally, the second photoresist layer 22 above the DRAM circuit region 201a is removed.

Figure 2H:
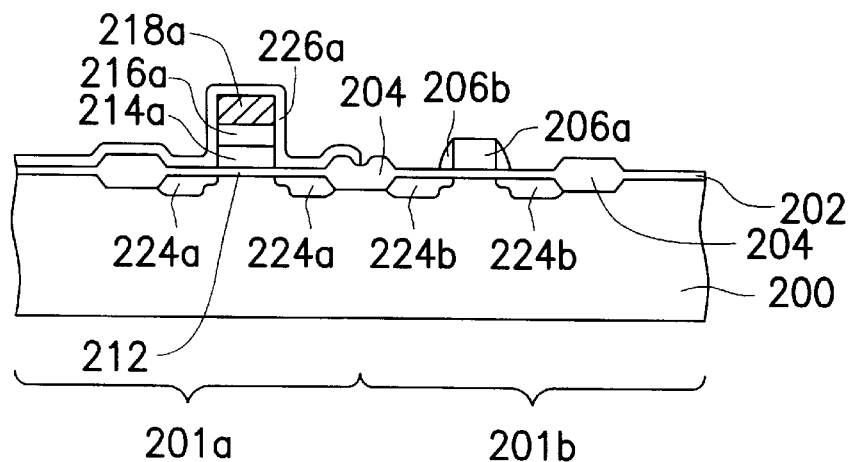

Subsequently, the DRAM devices, and lightly doped drain structures are formed in the source/drain regions 224a and 224b on each side of the first polysilicon layer 206a. After that. A thin nitride layer 226a is deposited and a spacer mask is implemented to cover DRAM region and is followed by a nitride etch back. Finally, spacers 206b is formed on the sidewalls of the logic gate structures. As shown in FIG. 2H, the remaining etching barrier layer 208a is removed after spacer formation.

Figure 2I:
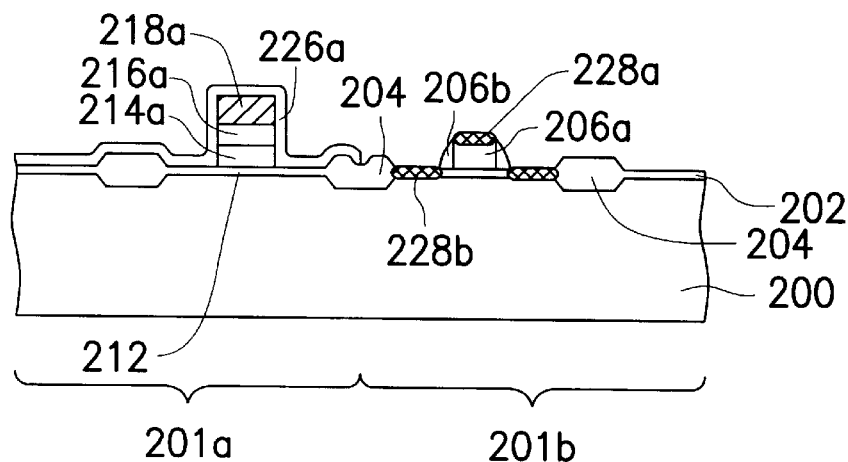

Thereafter, as shown in FIG. 2I, a self-aligned silicide operation is carried out to form metallic silicide layer 228a above the first polysilicon layer 206a and metallic silicide layers 228b above the source/drain regions 224b of logic device. The metallic silicide layers 228a and 228b can be titanium silicide or cobalt silicide layers. The silicide layers 228a and 228b are formed by conventional method, for example, first depositing a metallic layer (not shown), for example, titanium or cobalt, over the logic circuit region 201b, and then heating so that the silicon in the first polysilicon layer 206a and the source/drain regions 224b reacts with the metal to form self-aligned silicide layers 228a and 228b. Thereafter, the unreacted metal is removed to form the structure as shown in FIG. 2I, wherein the first polysilicon layer 206b and the self-aligned silicide layer 228a together form the gate structure in the logic circuit region 201b.

In summary, one major aspect of this invention is the use of just two masks to pattern out the gate structures in the DRAM circuit region and the logic circuit region. The gate structure in the DRAM circuit region comprises a tungsten silicide layer and a polysilicon layer, whereas the gate structure in the logic circuit region comprises a self-aligned silicide layer and a polysilicon layer. Furthermore, the thickness of the polysilicon layer in the DRAM gate and the logic gate are different. Since fewer masks are used compared with the conventional method, production cost can be reduced.

Another aspect of this invention is that among the two masks used for fabrication of the embedded DRAM, only one mask is critical and requires high alignment accuracy. The other mask is non-critical, and hence higher alignment errors are tolerated. This has the advantage of simplifying manufacturing process and reducing cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing embedded DRAM, comprising the steps of:

providing a semiconductor substrate having a field oxide layer and a first gate oxide layer thereon, wherein the semiconductor substrate includes a memory circuit region and a logic circuit region;

forming a first polysilicon layer and an etching barrier layer over the semiconductor substrate;

removing the etching barrier layer, the first polysilicon layer and the first gate oxide layer above the memory circuit region;

forming a second gate oxide layer over substrate in the memory circuit region;

forming a second polysilicon layer, a tungsten silicide layer and a silicon nitride layer above the second gate oxide layer and the etching barrier layer;

forming a memory gate pattern and a logic gate pattern over the substrate structure;

removing a portion of the silicon nitride layer, the tungsten silicide layer and the second polysilicon layer to expose the etching barrier layer in the logic circuit region and the second gate oxide layer in the memory circuit region forming a memory gate structure;

removing a portion of the etching barrier layer and the first polysilicon layer to expose the first gate oxide layer using the silicon nitride layer, tungsten silicide layer and second polysilicon layer above the logic circuit region as a hard mask;

removing the etching barrier layer above the first polysilicon layer;

forming spacers on the sidewalls of the first polysilicon layer and the sidewalls of the memory gate structure;

forming a first source/drain region in the substrate on each side of the memory gate structure, and forming a second source/drain region in the substrate on each side of the first polysilicon layer; and forming a self-aligned silicide layer over the first polysilicon layer and the second source/drain regions, wherein the first polysilicon layer and the self-aligned silicide layers together constitute a logic gate.

2. The method of claim 1, wherein the first polysilicon layer has a thickness of about 2000 Å.

3. The method of claim 1, wherein the step of forming the etching barrier layer includes depositing silicon nitride to form a silicon nitride layer.

4. The method of claim 1, wherein the step of forming the etching barrier layer includes depositing silicon dioxide to form a silicon dioxide layer.

5. The method of claim 1, wherein the etching barrier layer has a thickness of about 300 Å.

6. The method of claim 1, wherein the second polysilicon layer has a thickness of about 1000 Å.

7. The method of claim 1, wherein the tungsten silicide layer has a thickness of about 1000 Å.

8. The method of claim 1, wherein the silicon nitride layer has a thickness of about 1000 Å.

9. The method of claim 1, wherein the step of forming the self-aligned silicide layer includes reacting silicon with titanium to form a titanium silicide layer.

10. The method of claim 1, wherein the step of forming the self-aligned silicide layer includes reacting silicon with cobalt to form a cobalt silicide layer.

11. The method of claim 1, wherein the step of forming the first source/drain region and the second source/drain region includes implanting ions in steps to form a lightly doped drain region.

12. The method of claim 1, wherein after the step of etching the etching barrier layer and the first polysilicon layer using the hard mask, the hard mask is also removed.

13. A method of manufacturing embedded DRAM, comprising the steps of:

provoiding a semiconductor substrate having a field oxide layer and a first gate oxide layer thereon, wherein the semiconductor substrate includes a memory circuit region and a logic circuit region;

forming a first polysilicon layer and an etching barrier layer over the semiconductor substrate;

removing the etching barrier layer, the first polysilicon layer and the first gate oxide layer above the memory circuit region;

forming a second gate oxide layer over the substrate in the memory circuit region;

forming a second polysilicon layer above the second gate oxide layer and the etching barrier layer;

forming a tungsten silicide layer over the second polysilicon layer;

forming a silicon nitride layer over the tungsten silicide layer;

forming a first photoresist layer over the silicon nitride layer;

performing a photolithographic and etching operation to remove a portion of the silicon nitride layer, the tungsten silicide layer and the second polysilicon layer so that a memory gate is formed exposing the second gate oxide layer in the memory circuit region, while the etching barrier layer is exposed in the logic circuit region;

removing the first photoresist layer;

forming a second photoresist layer over the memory circuit region;

etching to remove the etching barrier layer and the first polysilicon layer through a hard mask layer comprising the remaining portion of the silicon nitride layer, the tungsten silicide layer and the second polysilicon layer in the logic circuit region, wherein the hard mask is also removed after the etching operation;

removing the second photoresist layer;

removing the remaining etching barrier layer;

forming spacers on the sidewalls of the memory gate and the sidewalls of the remaining first polysilicon layer;

forming source/drain regions having a lightly doped drain structure in the substrate in both the memory circuit region and the logic circuit region; and forming self-aligned silicide layers over the first polysilicon layer and the source/drain regions in the logic circuit region.

14. The method of claim 13, wherein the first polysilicon layer has a thickness of about 2000 Å.

15. The method of claim 13, wherein the step of forming the etching barrier layer includes depositing silicon nitride to form a silicon nitride layer.

16. The method of claim 13, wherein the step of forming the etching barrier layer includes depositing silicon dioxide to form a silicon dioxide layer.

17. The method of claim 13, wherein the etching barrier layer has a thickness of about 300 Å.

18. The method of claim 13, wherein the second polysilicon layer has a thickness of about 1000 Å.

19. The method of claim 13, wherein the tungsten silicide layer has a thickness of about 1000 Å.

20. The method of claim 13, wherein the silicon nitride layer has a thickness of about 1000 Å.

21. The method of claim 13, wherein the step of forming the self-aligned silicide layer includes reacting silicon with titanium to form a titanium silicide layer.

22. The method of claim 13, wherein the step of forming the self-aligned silicide layer includes reacting silicon with cobalt to form a cobalt silicide layer.

* * * * *